(12) United States Patent
Ni

(10) Patent No.: US 11,849,623 B1
(45) Date of Patent: Dec. 19, 2023

(54) DISPLAY PANEL AND DISPLAY DEVICE

(71) Applicant: Wuhan China Star Optoelectronics Semiconductor Display Technology Co., Ltd., Hubei (CN)

(72) Inventor: Jing Ni, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/976,824

(22) Filed: Oct. 30, 2022

(30) Foreign Application Priority Data

Aug. 24, 2022 (CN) .......................... 202211015717.4

(51) Int. Cl.
*H10K 59/40* (2023.01)
*G06F 3/044* (2006.01)
*G06F 3/041* (2006.01)
*H10K 50/844* (2023.01)
*H10K 50/858* (2023.01)

(52) U.S. Cl.
CPC ........... *H10K 59/40* (2023.02); *G06F 3/0412* (2013.01); *G06F 3/0446* (2019.05); *H10K 50/844* (2023.02); *H10K 50/858* (2023.02); *G06F 2203/04111* (2013.01)

(58) Field of Classification Search
CPC .... H10K 59/40; H10K 50/858; H10K 50/844; G06F 3/0446; G06F 3/0412; G06F 2203/04111
See application file for complete search history.

(56) References Cited

U.S. PATENT DOCUMENTS

2019/0051711 A1* 2/2019 Lee ..................... G09G 3/3208
2019/0221778 A1 7/2019 Kim et al.
(Continued)

FOREIGN PATENT DOCUMENTS

| CN | 108766980 | 11/2018 |
| CN | 111599850 | 8/2020 |
| CN | 111613628 | 9/2020 |

(Continued)

OTHER PUBLICATIONS

Notification of Office Action and Search Report dated May 31, 2023 From The State Intellectual Property Office of the People's Republic of China Re. Application No. 202211015717.4 and Its Translation Into English. (16 Pages).

*Primary Examiner* — Robin J Mishler

(57) ABSTRACT

The present application discloses a display panel and a display device, including a substrate; a light-emitting layer disposed on a side of the substrate, wherein the light-emitting layer includes a plurality of light-emitting units; an encapsulation layer disposed on a side of the light-emitting layer away from the substrate; a first insulating layer disposed on a side of the encapsulation layer away from the substrate, wherein the first insulating layer includes a plurality of protruding structures arranged in a one-to-one correspondence with the plurality of light-emitting units; a second insulating layer covering the plurality of protruding structures, wherein a refractive index of the second insulating layer is smaller than a refractive index of the first insulating layer, and a surface of a side of the encapsulation layer close to the first insulating layer is provided with a first groove.

17 Claims, 5 Drawing Sheets

(56) References Cited

U.S. PATENT DOCUMENTS

2022/0037622 A1* 2/2022 Cai ..................... H10K 50/865
2022/0085337 A1* 3/2022 Cai ..................... H10K 59/12

FOREIGN PATENT DOCUMENTS

| | | |
|---|---|---|
| CN | 111653683 | 9/2020 |
| CN | 111668384 | 9/2020 |
| CN | 111697037 | 9/2020 |
| CN | 111834544 | 10/2020 |
| CN | 111883684 | 11/2020 |
| CN | 112289958 | 1/2021 |
| CN | 112885972 | 6/2021 |
| CN | 113013203 | 6/2021 |
| CN | 113140608 | 7/2021 |
| CN | 113270463 | 8/2021 |
| CN | 113328047 | 8/2021 |
| CN | 114122285 | 3/2022 |
| CN | 114497421 | 5/2022 |
| WO | WO 2021/254228 | 2/2021 |
| WO | WO 2022/149554 | 7/2022 |

\* cited by examiner

DISPLAY PANEL AND DISPLAY DEVICE

RELATED APPLICATION

This application claims the benefit of priority of Chinese Patent Application No. 202211015717.4 filed on Aug. 24, 2022, the contents of which are incorporated by reference as if fully set forth herein in their entirety.

BACKGROUND OF INVENTION

Field of Invention

The present application relates to the field of display technology, and in particular, to a display panel and a display device.

Description of Prior Art

Organic light-emitting diode (OLED) has attracted great attention from academia and industry because of its huge development potential in the direction of solid-state lighting and flat panel display. As OLED panels can be made lighter and thinner, flexible OLED display technology will be the future development trend.

Usually, in order to reduce reflection of external light on a light-emitting side of the OLED display panel, a polarizer is also added on the light-emitting side of the panel, but adding a polarizer will lead to a large loss in the light-emitting efficiency of the panel. In order to improve the light-emitting efficiency of the OLED display panel, a micro-lens pattern (MLP) is generally also fabricated on the light-emitting side of the OLED display panel. However, the micro-lens pattern in the existing OLED display panel has a limited effect on improving the light extraction efficiency, and needs to be further improved.

SUMMARY OF INVENTION

The present application provides a display panel and a display device, which can more effectively improve the light extraction efficiency of the display panel at a front viewing angle.

The present application provides a display panel, including:
- a substrate;
- a light-emitting layer disposed on a side of the substrate, wherein the light-emitting layer includes a plurality of light-emitting units;
- an encapsulation layer disposed on a side of the light-emitting layer away from the substrate;
- a first insulating layer disposed on a side of the encapsulation layer away from the substrate, wherein the first insulating layer includes a plurality of protruding structures arranged in a one-to-one correspondence with the plurality of light-emitting units; and
- a second insulating layer disposed on a side of the first insulating layer away from the substrate and covering the plurality of protruding structures, wherein a refractive index of the second insulating layer is smaller than a refractive index of the first insulating layer,
- wherein a surface of a side of the encapsulation layer close to the first insulating layer is provided with a first groove, the first groove is defined close to an edge of the plurality of protruding structures, the second insulating layer is filled in the first groove, and a refractive index of the encapsulation layer is greater than the refractive.

Optionally, an included angle between a sidewall and a bottom surface of each of the protruding structures is greater than 0 and less than 90°.

Optionally, the first groove includes a first sidewall adjacent to an adjacent one of the protruding structures, and the adjacent one of the protruding structures includes a second sidewall adjacent to the first groove; and
   wherein the first sidewall and the second sidewall are connected to each other and located on a same continuous surface.

Optionally, a side of the first groove close to a corresponding one of the light-emitting units is arc-shaped, and a depth of the first groove is greater than 0 and less than or equal to 1000 nanometers.

Optionally, the encapsulation layer includes a first inorganic encapsulation sub-layer, an organic encapsulation sub-layer, and a second inorganic encapsulation sub-layer sequentially stacked on the light-emitting layer; and
   wherein the first groove is arranged on a surface of the second inorganic encapsulation sub-layer close to the first insulating layer, and a refractive index of the second inorganic encapsulation sub-layer is greater than the refractive index of the second insulating layer.

Optionally, the first groove is disposed around the protruding structures.

Optionally, each of the protruding structures includes a first sub-protruding structure and a second sub-protruding structure stacked on the encapsulation layer in sequence, a first included angle is formed between a sidewall of the first sub-protruding structure and a bottom surface of the first sub-protruding structure, and a second included angle is formed between a sidewall of the second sub-protruding structure and a bottom surface of the second sub-protruding structure; and
   wherein the first included angle is greater than the second included angle, and each of the first included angle and the second included angle is greater than 0° and less than 90°.

Optionally, a material of the first insulating layer includes an inorganic insulating material, and a material of the second insulating layer includes an organic insulating material.

Optionally, the display panel further includes a touch-control layer disposed on the side of the encapsulation layer away from the substrate, and the touch-control layer includes the first insulating layer, a touch-control metal layer, and the second insulating layer; and
   wherein the touch-control metal layer is disposed between the plurality of protruding structures.

Optionally, the first insulating layer includes a first insulating sub-layer and a second insulating sub-layer sequentially stacked on the encapsulation layer, a refractive index of each of the insulating layer and the second insulating sub-layer is greater than the refractive index of the second insulating layer; and
   wherein a material of the protruding structures is same as a material of at least one of the first insulating sub-layer or the second insulating sub-layer.

Optionally, each of the protruding structures includes a first sub-protruding structure and a second sub-protruding structure stacked on the encapsulation layer in sequence, a first included angle is formed between a sidewall of the first sub-protruding structure and a bottom surface of the first sub-protruding structure, a second included angle is formed between a sidewall of the second sub-protruding structure and a bottom surface of the second sub-protruding structure, the first included angle is greater than the second included angle, and each of the first included angle and the second included angle is greater than 0° and less than 90°; and wherein the first sub-protruding structure is located in the first insulating sub-layer, and the second sub-protruding structure is located in the second insulating sub-layer.

Optionally, a height of the first sub-protruding structure in a direction perpendicular to the substrate is greater than or equal to a height of the second sub-protruding structure in the direction perpendicular to the substrate.

Optionally, the materials of the first insulating sub-layer and the second insulating sub-layer are same.

Optionally, the touch-control layer includes at least a bridge region, the touch-control metal layer includes a first touch-control metal sub-layer and a second touch-control metal sub-layer, the touch-control layer in the bridge region includes the first insulating sub-layer, the first touch-control metal sub-layer, the second insulating sub-layer, the second touch-control metal sub-layers, and the second insulating layer stacked on the encapsulation layer in sequence; and the second touch-control metal sub-layer is electrically connected to the first touch-control metal sub-layer through a through hole penetrating the second insulating sub-layer; and wherein an orthographic projection of the first groove on the substrate is at least between an orthographic projection of the bridge region on the substrate and an orthographic projection of the protruding structures on the substrate, a surface of a side of the first touch-control metal sub-layer away from the substrate is provided with a second groove correspondingly communicated with the through hole, and the second touch-control metal sub-layer is further disposed in the second groove.

Optionally, the touch-control layer further includes a non-bridge region, and the touch-control layer in the non-bridge region includes the first insulating sub-layer, the second insulating sub-layer, the second touch-control metal sub-layer, and the second insulating layer stacked on the encapsulation layer in sequence; or wherein the touch-control layer in the non-bridge region includes the first insulating sub-layer, the first touch-control metal sub-layer, the second insulating sub-layer, and the second insulating layer stacked on the encapsulation layer in sequence; and wherein, the orthographic projection of the first groove on the substrate is further located between an orthographic projection of the non-bridge region on the substrate and the orthographic projection of the protruding structures on the substrate.

Optionally, the touch-control layer further includes a non-bridge region; the touch-control layer in the non-bridge region includes the first touch-control metal sub-layer and the second insulating layer stacked on the encapsulation layer in sequence, or the touch-control layer in the non-bridge region includes the second touch-control metal sub-layer and the second insulating layer stacked on the encapsulation layer in sequence; and wherein the orthographic projection of the first groove on the substrate is further located between orthographic projections of any two of the protruding structures adjacent to the non-bridge region on the substrate.

The present application also provides a display device including the above-mentioned display panel.

In the display panel and the display device provided by the present application, the protruding structure is located in the first insulating layer with a larger refractive index, and the second insulating layer with a smaller refractive index covers the protruding structure, so that the protruding structure and the second insulating layer constitute a micro-lens pattern (MLP) for improving light extraction efficiency. In addition, a surface of a side of the encapsulation layer with a larger refractive index close to the first insulating layer is provided with a first groove close to an edge of the protruding structure, and the second insulating layer with a smaller refractive index is filled in the first groove, so that part of the encapsulation layer corresponding to the protruding structure and the second insulating layer also constitute a micro-lens pattern for improving the light extraction efficiency, which can further improve the light extraction efficiency of the display panel. It is appreciated that the arrangement of the first groove effectively increases an interface area between the optically dense medium and the optically sparse medium, so that a wider range of lateral light can be directed towards a direction of the front viewing angle. Compared with the prior art, the light extraction efficiency at the front viewing angle of the display panel can be more effectively improved.

BRIEF DESCRIPTION OF DRAWINGS

The technical solutions and other beneficial effects of the present application will be apparent through the detailed description of the specific embodiments of the present application in conjunction with the accompanying drawings.

DETAILED DESCRIPTION OF PREFERRED EMBODIMENTS

Figure 1:
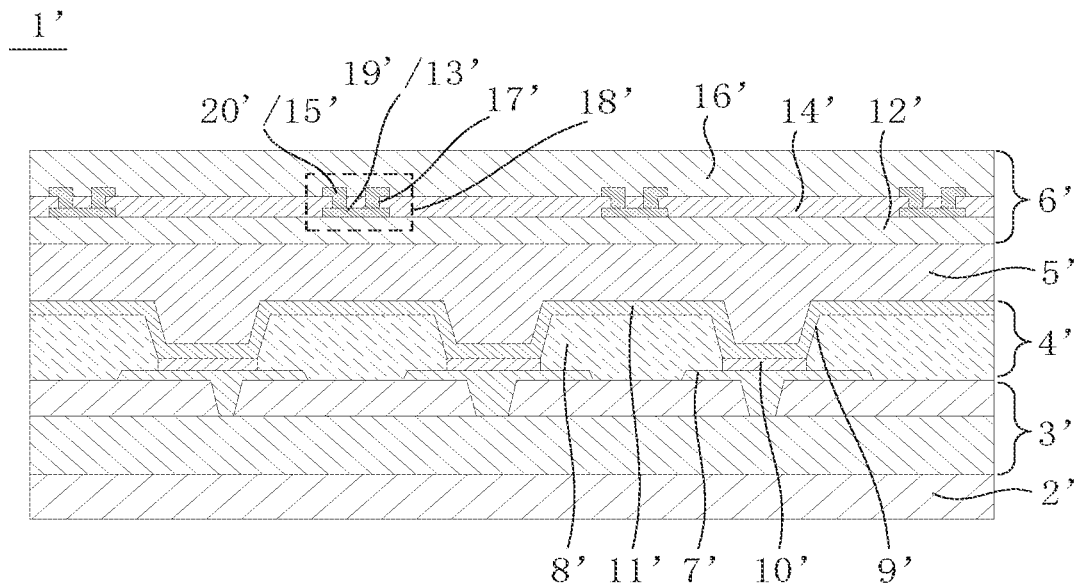
FIG. 1 is a schematic diagram of a partial cross-sectional structure of an exemplary OLED touch display panel.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In the description of this application, it should be understood that the terms "center", "longitudinal", "transverse", "length", "width", "thickness", "upper", "lower", "front", "Rear", "left", "right", "vertical", "horizontal", "top", "bottom", "inside", "outside", "clockwise", "counterclockwise", and the like are based on the orientation or positional relationship shown in the drawings, and is merely for the convenience of describing the present invention and simplifying the description, rather than indicating or implying that the device or element referred to must have a specific orientation, structure and operation in a specific orientation, which should not be construed as limitations on the present invention. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

In the description of this application, it should be noted that the terms "installation", "connected", and "connected" should be understood in a broad sense unless explicitly stated and limited otherwise. For example, it can be a fixed connection, a detachable connection, or an integral connection; it can also be a mechanical connection or an electrical connection; it can be a direct connection; or it can be an indirect connection through an intermediate medium; or it can be a communication between two components.

In the present invention, unless otherwise expressly stated and limited, the formation of a first feature over or under a second feature in the description that follows may include embodiments in which the first and second features are formed in direct contact, and may also include embodiments in which additional features may be formed between the first and second features, such that the first and second features may not be in direct contact. Moreover, the first feature "above", "over" and "on" the second feature includes the first feature directly above and above the second feature, or merely indicating that the first feature is at a level higher than the second feature. The first feature "below", "under" and "beneath" the second feature includes the first feature directly below and obliquely below the second feature, or merely the first feature has a level lower than the second feature.

The following disclosure provides many different embodiments or examples for realizing different structures of the present application. To simplify the disclosure of the present application, the components and settings of specific examples are described below. Of course, they are only examples and are not intended to limit the application. In addition, the present application may repeat reference numerals and/or reference letters in different examples. Such repetition is for the purpose of simplification and clarity, and does not indicate the relationship between the various embodiments and/or settings discussed. In addition, this application provides examples of various specific processes and materials, but those of ordinary skill in the art may be aware of the applications of other processes and/or the use of other materials.

Figure 3:
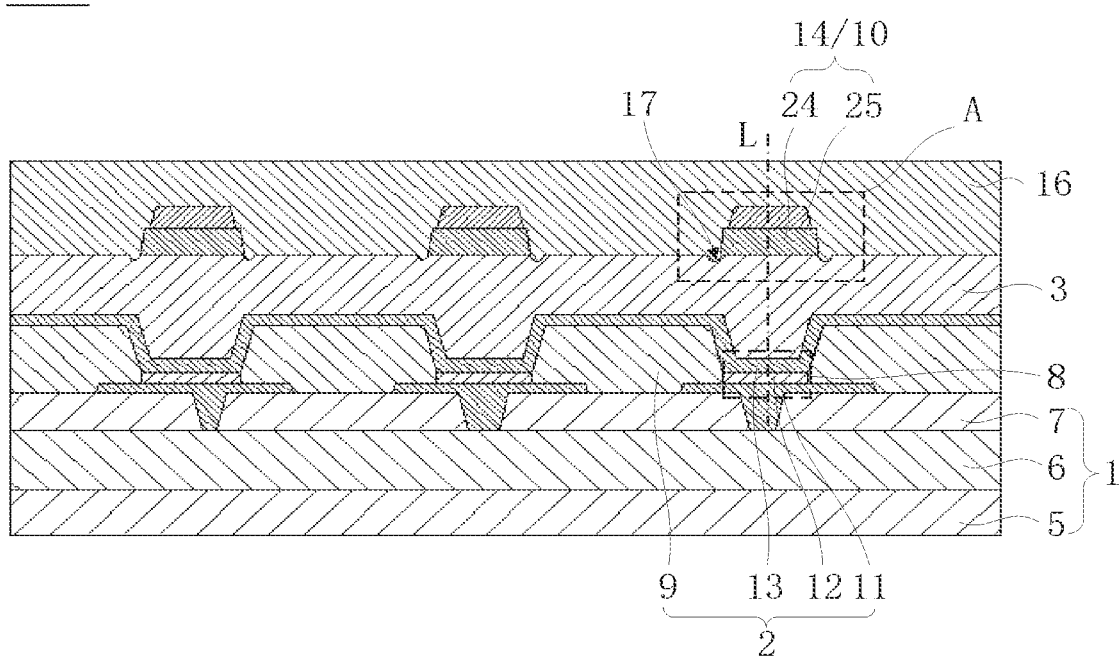
FIG. 3 is a schematic diagram of a partial cross-sectional structure of a display panel according to an embodiment of the present application.
Figure 4:
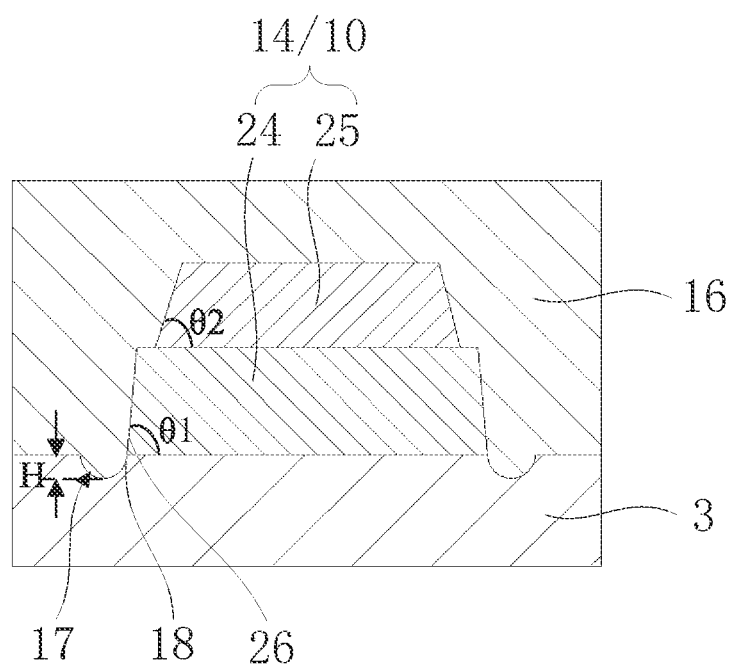
FIG. 4 is a partial enlarged view of the area A in FIG. 3.

As shown in FIGS. 3 and 4, an embodiment of the present application provides a display panel 100. The display panel 100 includes an array substrate 1, a light-emitting layer 2, an encapsulation layer 3, a first insulating layer 10, and the second insulating layer 16 that are sequentially arranged on the array substrate 1.

Specifically, the array substrate 1 includes a substrate 5, and an array layer 6 and a planarization layer 7 sequentially located on the substrate 5; the material of the substrate 5 includes polyimide (PI), but the present application is not particularly limited thereto; the array layer 6 includes a plurality of driving circuit units, and each of the driving circuit units includes at least one thin film transistor. It is appreciated that the substrate 5 may be a flexible substrate, and correspondingly, the display panel 100 may be a flexible display panel.

Specifically, the light-emitting layer 2 is disposed on one side of the substrate 5, and specifically the light-emitting layer 2 includes a plurality of light-emitting units 8 located on the planarization layer 7 and spaced apart from each other. The plurality of light-emitting units 8 are electrically connected to the plurality of driving circuit units in one-to-one correspondence.

Specifically, the light-emitting layer 2 further includes a pixel definition layer 9 on the array substrate 1 and a plurality of pixel openings penetrating the pixel definition layer 9. The plurality of light-emitting units 8 are arranged in a one-to-one correspondence with the plurality of pixel openings; each of the light-emitting units 8 includes an anode 11 located between the pixel definition layer 9 and the array substrate 1 and partially exposed by the pixel opening, and a light-emitting material layer 12 and a cathode 13 that are sequentially stacked on the anode 11 arranged in the pixel opening. A side of the anode 11 away from the light-emitting material layer 12 further penetrates through the planarization layer 7 to electrically connect the driving circuit unit in the array layer 6. In a specific embodiment, different light-emitting units 8 may share a layer of cathode 13.

Specifically, the type of the light-emitting units 8 includes OLED, but the present application is not particularly limited thereto.

Specifically, the encapsulation layer 3 is disposed on the side of the light-emitting layer 2 away from the substrate 5 and covers the plurality of light-emitting units 8. It is appreciated that the encapsulation layer 3 covers the entirety of the light-emitting layer 2. In a specific embodiment, the encapsulation layer 3 includes a first inorganic encapsulation sub-layer, an organic encapsulation sub-layer, and a second inorganic encapsulation sub-layer which are sequentially stacked on the light-emitting layer 2.

Specifically, the first insulating layer 10 is disposed on the side of the encapsulation layer 3 away from the substrate 5, and the first insulating layer 10 includes a plurality of protruding structures 14 arranged in a one-to-one correspondence with the plurality of light-emitting units 8. Specifically, an included angle between a sidewall of the protruding structure 14 and a bottom surface of the protruding structure 14 is greater than 0 and less than 90°. It is appreciated that the sidewalls of the protruding structures 14 are slope-shaped.

Specifically, the second insulating layer 16 is disposed on the side of the first insulating layer 10 away from the substrate 5, and a refractive index of the second insulating layer 16 is smaller than a refractive index of the first insulating layer 10.

Since the protruding structures 14 are disposed corresponding to the light-emitting units 8, the refractive index of the protruding structures 14 is greater than the refractive index of the second insulating layer 16, and the sidewalls of the protruding structures 14 are slope-shaped, so that a lateral light emitted by the light-emitting units 8 (light with a large angle) is incident on the sidewall of the protruding structure 14 through the protruding structure 14 with a higher refractive index and is refracted out from the second insulating layer 16 with a lower refractive index, which is equivalent to the lateral light emitted by the light-emitting units 8 from the optically dense medium to the optically sparse medium. Since the refraction angle is greater than the incident angle, the lateral light emitted by the light-emitting units 8 is directed toward the front viewing angle direction, which is beneficial to improve the light extraction efficiency of the display panel 100 at the front viewing angle. It is appreciated that the protruding structure 14 with a larger refractive index and the second insulating layer 16 with a smaller refractive index in the embodiment of the present application constitute a micro-lens pattern (MLP) for light extraction, which is beneficial to improve the light-emitting efficiency of the display panel 100 at the front viewing angle.

In a specific embodiment, as shown in FIG. 4, the protruding structure 14 includes a first sub-protruding structure 24 and a second sub-protruding structure 25 that are sequentially stacked on the encapsulation layer 3; a first included angle is formed between a sidewall of the first sub-protruding structure 24 and a bottom surface of the first sub-protruding structure 24, and a second included angle is formed between a sidewall of the second sub-protruding structure 25 and a bottom surface of the second sub-protruding structure 25; wherein the first included angle $\theta 1$ is greater than the second included angle $\theta 2$, and both the first included angle $\theta 1$ and the second included angle $\theta 2$ are greater than 0° and less than 90°. Of course, in other embodiments, the process can be adjusted so that the first included angle $\theta 1$ is less than or equal to the second included angle $\theta 2$. It should be noted that it is easier to achieve in the process that the first included angle $\theta 1$ is greater than the second included angle $\theta 2$.

Specifically, an orthographic projection of the protruding structures 14 on the substrate 5 completely covers an orthographic projection of the corresponding light-emitting units 8 on the substrate 5, so that most of the lateral light emitted by the light-emitting units 8 can pass through the sidewalls of the protruding structures 14 to be directed toward the front viewing angle direction, which is beneficial to improve the light extraction efficiency in a wide range.

Specifically, a center of the orthographic projection of the protruding structure 14 on the substrate 5 coincides with a center of the orthographic projection of the corresponding light-emitting unit 8 on the substrate 5. In a specific embodiment, each of the protruding structures 14 is an axis-symmetric structure, and an extending direction of a symmetry axis L of the protruding structure 14 is perpendicular to the array substrate 1. The light-emitting unit 8 corresponding to the protruding structure 14 is also a symmetric structure with respect to the symmetry axis L. It is appreciated that the center of the orthographic projection of the protruding structure 14 on the array substrate 1 coincides with the center of the orthographic projection of the corresponding light-emitting unit 8 on the array substrate 1, which is beneficial to the lateral light around the light-emitting unit 8 uniformly and effectively to be directed toward the front viewing angle direction, thus beneficial to improve the display effect.

Specifically, as shown in FIGS. 3 and 4, a surface of a side of the encapsulation layer 3 close to the first insulating layer 10 is provided with a first groove 17, the first groove 17 is defined close to an edge of the plurality of protruding structures 14, the second insulating layer 16 is filled in the first groove 17, and a refractive index of the encapsulation layer 3 is greater than the refractive of the second insulating layer 16.

The first grooves 17 are disposed close to the protruding structures 14, the second insulating layer 16 is filled in the first grooves 17, and the refractive index of the encapsulation layer 3 is greater than that of the second insulating layer 16, so that a part of the encapsulation layer 3 and the second insulating layer 16 corresponding to the protruding structures 14 also constitute a micro-lens pattern for light extraction. It is appreciated that the arrangement of the first groove 17 effectively increases the interface area between the optically dense medium and the optically sparse medium, so that a wider range of lateral light can be directed toward the direction of the front viewing angle, which is beneficial to further improve the light extraction efficiency of the display panel 100 at the front viewing angle.

Specifically, as shown in FIG. 4, the first groove 17 includes a first sidewall 18 adjacent to an adjacent one of the protruding structures 18, and the adjacent one of the protruding structures 14 includes a second sidewall 26 adjacent to the first groove 17; and wherein the first sidewall 18 and the second sidewall 26 are connected to each other and located on a same continuous surface. That is, the first groove 17 is disposed closely adjacent to the protruding structure 14. Of course, in other embodiments, the first sidewall 18 is not in contact with the second sidewall 26, that is, the first groove 17 and the protruding structure 14 may also be spaced apart. In either case, the first groove 17 can increase the interface area between the optically denser medium and the optically sparser medium, so that a wider range of lateral light can be directed toward the direction of the front viewing angle, which is conducive to further improving the light extraction efficiency of the display panel 100 at the front viewing angle.

Specifically, the side of the first groove 17 close to the corresponding light-emitting unit 8 is arc-shaped, for example, the first sidewall 18 is arc-shaped. Of course, in other embodiments, the side of the first groove 17 close to the corresponding light-emitting unit 8 may be an inclined surface.

Specifically, a depth H of the first groove 17 is greater than 0 and less than or equal to 1000 nanometers. It is appreciated that controlling the depth of the first groove 17 can ensure that the encapsulation effect of the encapsulation layer 3 is not affected.

Specifically, when the encapsulation layer 3 includes a first inorganic encapsulation sub-layer, an organic encapsulation sub-layer, and a second inorganic encapsulation sub-layer that are sequentially stacked on the light-emitting layer 2; the first groove 17 is arranged on the surface of the second inorganic encapsulation sub-layer close to the first insulating layer 10, and the refractive index of the second inorganic encapsulation sub-layer is greater than the refractive index of the second insulating layer 16.

Specifically, the material of the first insulating layer 10 includes an inorganic insulating material, and the material of the second insulating layer 16 includes an organic insulating material. In addition, the encapsulation layer 3 is close to the first insulating layer 10, and the material used to form the first groove 17 is an inorganic packaging material, so that the material of the layer with higher refractive index in the formed micro-lens pattern is all inorganic material.

In the prior art, the micro-lens pattern is usually composed of two organic layers. Since the organic layer is made by coating and photolithograhy (light sensing) methods, the formed organic layer usually has a thicker film thickness, and improvement in the refractive index of the organic materials is limited, resulting in a thicker display panel and a limited improvement in light extraction efficiency.

Compared with the prior art, the materials of the layers with higher refractive index in the micro-lens pattern provided by the embodiments of the present application are all inorganic materials. Compared with organic materials, the refractive index of inorganic materials can be higher and the refractive index difference between the high and low refractive index layers can be easily increased, so that the light extraction efficiency can be more effectively improved. In addition, the inorganic material has lower requirements on the film thickness, which is beneficial to reduce the thickness of the display panel.

In a specific embodiment, the first groove 17 is disposed around the protruding structure 14, so that the lateral light emitted by the light-emitting unit 8 can be uniformly and effectively directed toward the front viewing angle direction, which is beneficial to improve the display effect. It is appreciated that the arrangement of the first grooves 17 around the protruding structures 14 means that the first grooves 17 are arranged around the bottom edges of the protruding structures 14.

Specifically, since the first groove 17 is located at the periphery of the protruding structure 14, when the orthographic projection of the protruding structure 14 on the substrate 5 completely covers the orthographic projection of the corresponding light-emitting unit 8 on the substrate 5, the micro-lens pattern formed by the encapsulation layer 3 and the second insulating layer 16 further expands the light extraction range, which is beneficial to further improve the light extraction efficiency.

Figure 5:
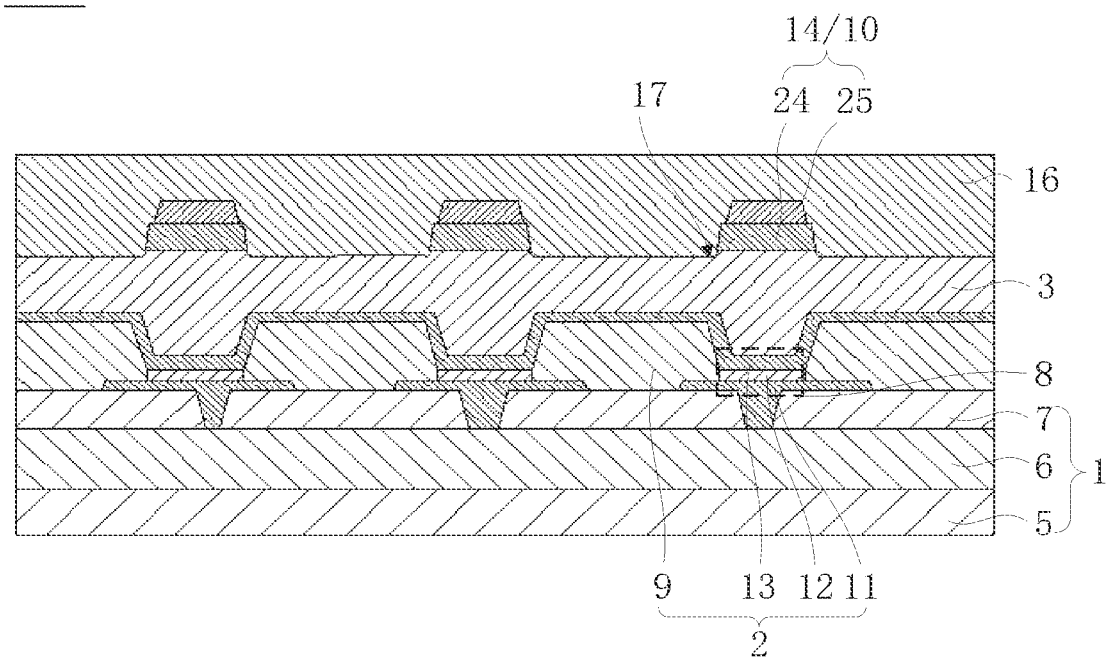
FIG. 5 is a schematic diagram of a partial cross-sectional structure of another display panel according to an embodiment of the present application.

Specifically, as shown in FIG. 3, two first grooves 17 may be provided between adjacent two of the protruding structures 14, and the two first grooves 17 are respectively corresponding to and adjacent to the two protruding structures 14. Of course, as shown in FIG. 5, only one first groove 17 may be provided between adjacent two of the protruding structures 14, and the two opposite sidewalls of the first groove 17 are adjacent to the adjacent two of the protruding structures 14.

In the embodiment of the present application, the protruding structures 14 are located in the first insulating layer 10 with a larger refractive index, and the second insulating layer 16 with a smaller refractive index covers the protruding structures 14, so that the protruding structures 14 and the second insulating layer 16 constitutes a micro-lens pattern (MLP) for improving light extraction efficiency. In addition, is provided with a first groove 17 close to the edge of the protruding structure 14 is provided on a surface of the encapsulation layer 3 with a larger refractive index close to the side of the first insulating layer 10. The second insulating layer 16 with a smaller refractive index is filled in the first groove 17, so that part of the encapsulation layer 3 and the second insulating layer 16 corresponding to the protruding structure 14 also constitute a micro-lens pattern for improving light extraction efficiency, so that the light extraction efficiency of the display panel can be further improved. It is appreciated that the arrangement of the first groove 17 effectively increases the interface area between the optically dense medium and the optically sparse medium, so that a wider range of lateral light can be directed toward the direction of the front viewing angle; Compared with the prior art, the light extraction efficiency of the display panel 100 at the front viewing angle can be more effectively improved. In addition, the materials of the high refractive index layers in the micro-lens patterns formed in the embodiments of the present application are all inorganic insulating materials, which can effectively improve light extraction efficiency and reduce the thickness of the display panel 100 compared with organic materials.

FIG. 1 provides a schematic diagram of a partial cross-sectional structure of an exemplary OLED touch display panel 1'. The display area of the touch display panel 1' includes a flexible substrate 2' and an array layer 3', the light-emitting layer 4', the encapsulation layer 5', and the touch-control layer 6' sequentially disposed on the flexible substrate 2'; wherein the array layer 3' is a composite layer composed of an inorganic film, an organic film, and a metal layer. The light-emitting layer 4' includes an anode layer 7' and a pixel definition layer (PDL) 8' on the array layer 3', a pixel opening 9' penetrating the pixel definition layer 8' and exposing part of the anode layer 7', and the light-emitting material layer 10' and the cathode 11' sequentially disposed in a pixel opening 9' and on the anode layer 7'; the encapsulation layer 5' includes an organic encapsulation layer and an inorganic encapsulation layer that are stacked; the touch-control layer 6' includes the first touch insulating layer 12', the first touch-control metal layer 13', the second touch insulating layer 14', the second touch-control metal layer 15', and the planarization layer 16' sequentially stacked on encapsulation layer 5'; and the second touch-control metal layer 15' is electrically connected to the first touch-control metal layer 13' through the through hole 17' passing through the second touch insulating layer 14'.

Figure 2:
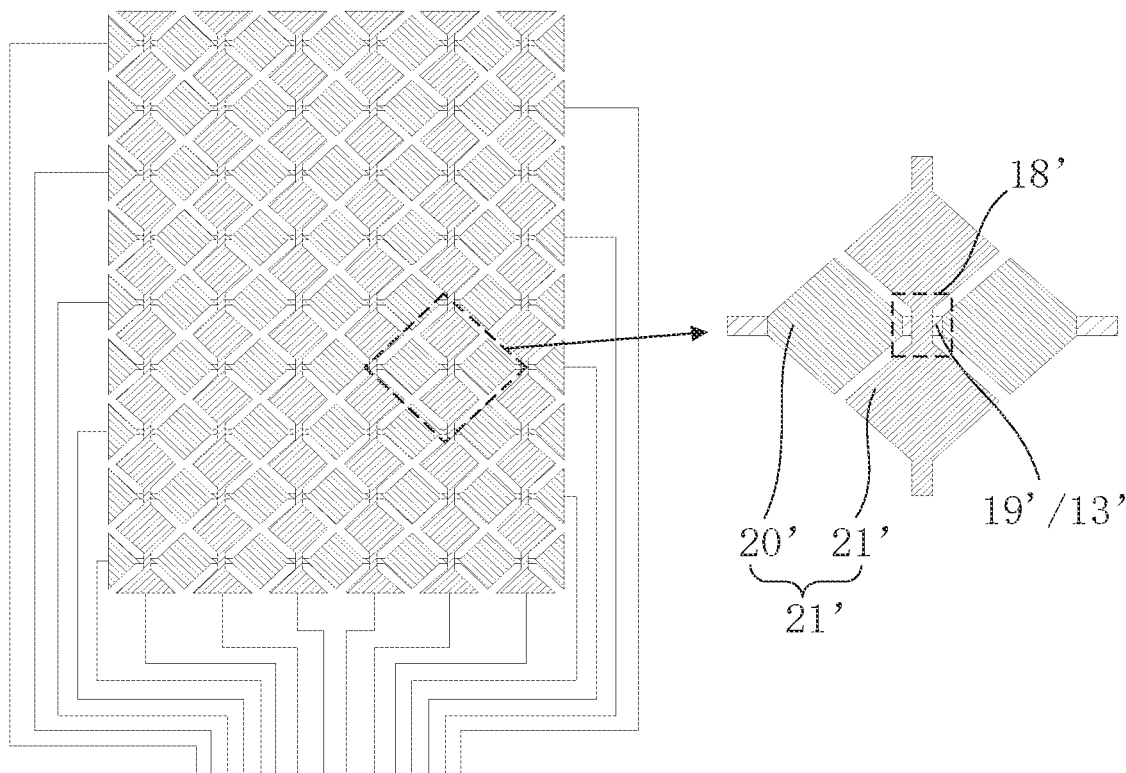
FIG. 2 is a schematic diagram of a distribution of touch-control electrodes in the OLED touch display panel shown in FIG. 1.

Specifically, the area where the second touch-control metal layer 15' is electrically connected to the first touch-control metal layer 13' is referred to as a bridge region 18'. The first touch-control metal layer 13' includes bridge lines 19' located in the bridge region 18', and the second touch-control metal layer 15' includes driving electrodes (Tr) 20' and sensing electrodes (Rx) 21' located in the bridge region 18' and the non-bridge region. In the bridge region 18', adjacent two of the driving electrodes 20' are electrically connected to each other through the bridge lines 19'. The driving electrodes Tr and the sensing electrodes Rx are in the same layer and spaced apart from each other, and both belong to the touch-control electrodes; the distribution of the touch-control electrodes in the conventional touch-control layer is shown in FIG. 2; wherein the intersection of the driving electrodes 20' and the sensing electrodes 21' is the bridge region 18'.

In order to reduce the reflection of external light on the light-emitting side of the panel, a polarizer is also added above the touch-control layer. However, adding a polarizer will cause a large loss of light-extraction efficiency of the OLED touch display panel. In order to improve the light extraction efficiency, an organic light extraction layer (micro-lens pattern) is usually added above the touch-control layer. However, the organic light extraction layer will increase the thickness of the OLED touch display panel, and the improvement in the light extraction efficiency is limited.

Figure 6:
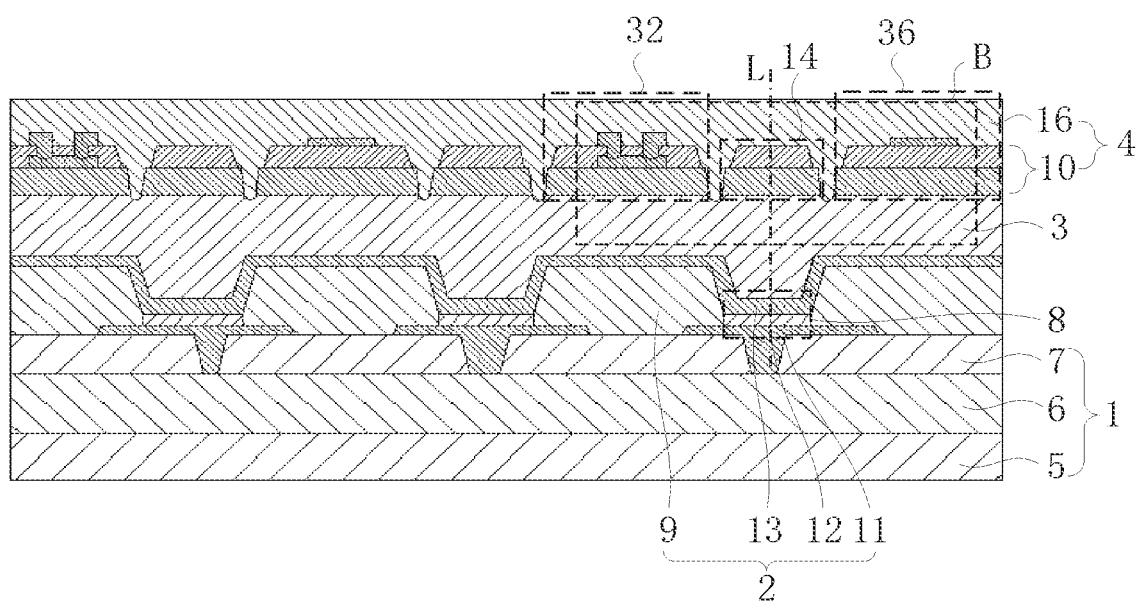
FIG. 6 is a schematic diagram of a partial cross-sectional structure of another display panel according to an embodiment of the present application.
Figure 7:
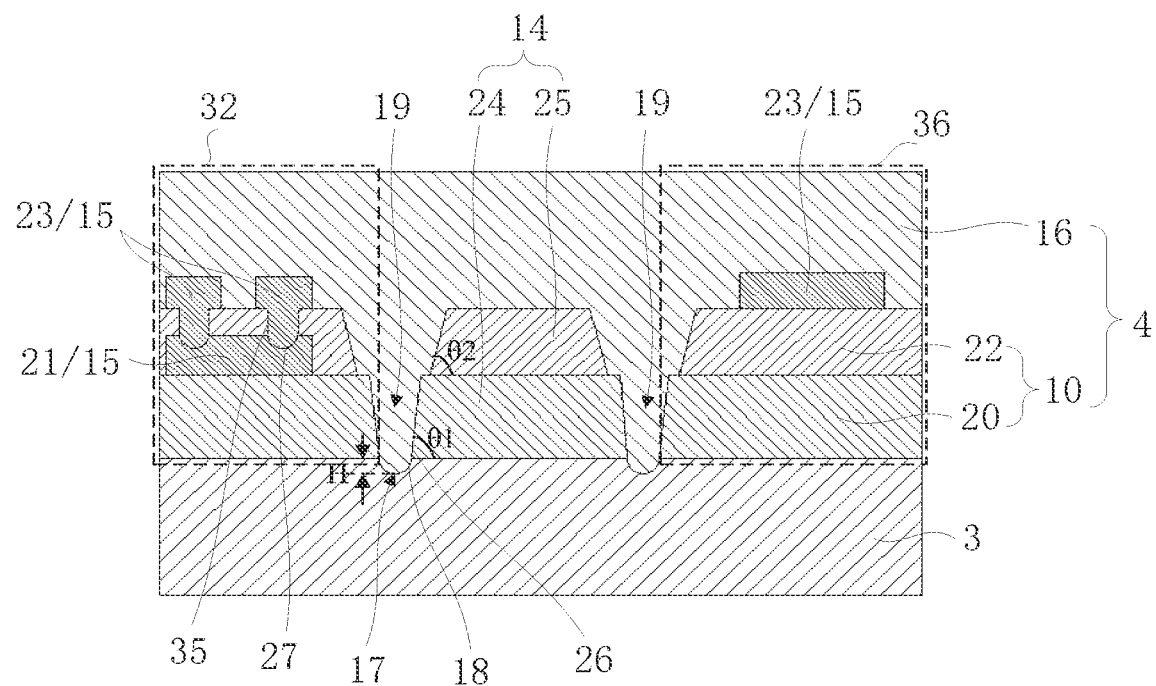
FIG. 7 is a partial enlarged view of the area B in FIG. 6.

In order to solve the technical problems existing in the above-mentioned OLED touch display panel 1', as shown in FIG. 6 and FIG. 7, an embodiment of the present application provides a display panel 100' with a touch function, which is different from the foregoing embodiments in that, the display panel 100' further includes a touch-control layer 4 disposed on the side of the encapsulation layer 3 away from the substrate 5; the touch-control layer 4 includes the first insulating layer 10, the touch-control metal layer 15, and the second insulating layer 16; and the touch-control metal layer 15 is located between the plurality of protruding structures 14.

It is appreciated that the embodiment of the present application is equivalent to further use the first insulating layer 10 and the second insulating layer 16 in the touch-control layer 4 as a micro-lens pattern, which can avoid additionally adding a layer for forming the micro-lens pattern. The thickness of the display panel 100' can be reduced while improving the light extraction efficiency of the display panel 100'.

Specifically, the first insulating layer 10 includes a first insulating sub-layer 20 and a second insulating sub-layer 22 stacked on the encapsulation layer 3 in sequence; and the refractive indices of the first insulating sub-layer 20 and the second insulating sub-layer 22 are both greater than the refractive index of the second insulating layer 16; wherein the material of the protruding structure 14 is the same as the material of of at least one of the first insulating sub-layer 20 or the second insulating sub-layer 22.

Specifically, the thickness of the protruding structure 14 is less than or equal to the sum of the thicknesses of the first insulating sub-layer 20 and the second insulating sub-layer 22. It should be noted that, the thickness in the embodiments of the present application refers to the height in the direction perpendicular to the array substrate 1.

It is appreciated that the protruding structure 14 may be formed from the first insulating sub-layer 20 or the second insulating sub-layer 22, or may be formed by stacking the first insulating sub-layer 20 and the second insulating sub-layer 22.

In a preferred embodiment, as shown in FIG. 7, the protruding structure 14 includes a first sub-protruding structure 24 and a second sub-protruding structure 25 that are sequentially stacked on the encapsulation layer 3. A first included angle θ1 is formed between the sidewall and the bottom surface of the first sub-protruding structure 24, and a second included angle θ2 is formed between the sidewall and the bottom surface of the second sub-protruding structure 25. The first included angle θ1 is greater than the second included angle θ2, and the first included angle θ1 and the second included angle θ2 are both greater than 0° and less than 90°; wherein the first sub-protruding structure 24 is located in the first insulating sub-layer 20; and the second sub-protruding structure 25 is located in the second insulating sub-layer 22.

Specifically, the height of the first sub-protruding structure 24 in the direction perpendicular to the substrate 5 is greater than or equal to the height of the second sub-protruding structure 25 in the direction perpendicular to the substrate 5. That is, the thickness of the first sub-protruding structure 24 is greater than or equal to the thickness of the second sub-protruding structure 25.

Specifically, the orthographic projection of the bottom surface of the first sub-protruding structure 24 on the encapsulation layer 3 completely covers the orthographic projection of the bottom surface of the second sub-protruding structure 25 on the encapsulation layer 3. In a preferred embodiment, the cross-sections of the first sub-protruding structure 24 and the second sub-protruding structure 25 in a direction perpendicular to the array substrate 1 both have shapes of regular trapezoids.

Specifically, limited by materials and manufacturing processes, the sidewall of the first sub-protruding structure 24 and the sidewall of the second sub-protruding structure 25 may be continuous or stepped. Preferably, the sidewall of the first sub-protruding structure and the sidewall of the second sub-protruding structure are continuous, that is, the two are directly connected to each other.

In the embodiment of the present application, the first included angle θ1 is greater than the second included angle θ2, the connection between the sidewall of the first sub-protruding structure and the sidewall of the second sub-protruding structure is slightly convex, and such an arrangement is easier to achieve in industry; of course, in other embodiments, the connection between the sidewall of the first sub-protruding structure and the sidewall of the second sub-protruding structure can be flat or slightly concave by adjusting the process.

Specifically, the materials of the first insulating sub-layer 20 and the second insulating sub-layer 22 include any one or more of SiN, SiON, ZrO, and TiO.

In a specific embodiment, the materials of the first insulating sub-layer 20 and the second insulating sub-layer 22 are the same and are inorganic insulating materials. Of course, in other embodiments, the materials of the first insulating sub-layer 20 and the second insulating sub-layer 22 may also be different, but the first insulating sub-layer 20 and the second insulating sub-layer 22 are both inorganic insulating materials, and the refractive indices of the insulating sub-layer 20 and the second insulating sub-layer 22 are both greater than the refractive index of the second insulating layer 16.

It is appreciated that when the materials of the first insulating sub-layer 20 and the second insulating sub-layer 22 are the same, and the refractive indices of the first sub-protruding structure 24 and the second sub-protruding structure 25 are the same.

Specifically, the touch-control layer 4 includes a bridge region 32; the touch-control metal layer 15 includes a first touch-control metal sub-layer 21 and a second touch-control metal sub-layer 23; the touch-control layer 4 in the bridge region 32 includes the first insulating sub-layer 20, the first touch-control metal sub-layer 21, the second insulating sub-layer 22, the second touch-control metal sub-layer 23, and the second insulating layer 16 sequentially stacked on the encapsulation layer 3; and the second touch-control metal sub-layer 23 is electrically connected to the first touch-control metal sub-layer 21 through the through hole 35 penetrating the second insulating sub-layer 22; wherein the orthographic projection of the first groove 17 on the substrate 5 is at least located between the orthographic projection of the bridge region 32 on the substrate and the orthographic projection of the protruding structure 14 on the substrate 5; the surface of the side of the first touch-control metal sub-layer 21 away from the substrate 5 is provided with a second groove 27 correspondingly communicated with the through hole 35; and the second touch-control metal sub-layer 23 is also located in the second groove 27.

It should be noted that a trench structure 19 correspondingly communicated with the first groove 17 is formed between the first insulating sub-layer 20 and the second insulating sub-layer 22 superimposed in the bridge region 32 and the protruding structure 14. When the protruding structure 14 is fabricated, the groove structure 19 and the through hole 35 can be formed in the same process. Since the first groove 17 is correspondingly communicated with the groove structure 19, and the second groove 27 is correspondingly communicated with the through hole 35, the first groove 17 and the second groove 27 may be formed by an etching process when the trench structure 19 and the through hole 35 are fabricated. That is, the first groove 17, the second groove 27, the trench structure 19, and the through hole 35 in the embodiment of the present application can be formed in the same process, which is beneficial to simplify the process.

In a specific embodiment, the first groove 17, the second groove 27, the trench structure 19 and the through hole 35 can be formed by using a halftone mask.

It is appreciated that in the embodiment of the present application, the insulating layer in the touch-control layer 4 is also used as a micro-lens pattern without changing the existing process flow, which is beneficial to saving costs.

Specifically, one of the first touch-control metal sub-layer 21 and the second touch-control metal sub-layer 23 is a touch-control electrode layer, and the other is a bridge metal layer. In the embodiment of the present application, it is taken as an example for illustration that the first touch-control metal sub-layer 21 is used as a bridge metal layer and the second touch-control metal sub-layer 23 is used as a touch-control electrode layer, but the present application is not particularly limited thereto.

Specifically, the touch-control layer 4 further includes a non-bridge region 36; the touch-control layer 4 located in the non-bridge region 36 includes a first insulating sub-layer 20, a second insulating sub-layer 22, a second insulating sub-layer 22, a touch-control metal sub-layer 23, and a second insulating layer 16, which are sequentially stacked on the encapsulation layer 3; wherein the orthographic projection of the first groove 17 on the substrate 5 is also located between the orthographic projection of the non-bridge region 36 on the substrate 5 and the orthographic projection of the protruding structure 14 on the substrate 5.

It is appreciated that a trench structure 19 correspondingly communicated with the first groove 17 is also formed between the first insulating sub-layer 20 and the second insulating sub-layer 22 stacked in the non-bridge region 36 and the protruding structure 14.

In a specific embodiment, the second touch-control metal sub-layer 23 includes a driving electrode and a sensing electrode spaced apart from each other, wherein the driving electrode located in the bridge region 32 include two driving sub-electrodes separated by the sensing electrode, and the two driving sub-electrodes are electrically connected to the first touch-control metal sub-layer 21 through the through holes 35, so as to realize the electrical connection between the two driving sub-electrodes.

Of course, in other embodiments, the touch-control layer located in the non-bridge region may further include a first insulating sub-layer, a first touch-control metal sub-layer, a second insulating sub-layer, and a second insulating layer, which are sequentially stacked on the encapsulation layer. In this case, the first touch-control metal sub-layer is a touch-control electrode layer, and the second touch-control metal sub-layer is a bridge metal layer.

In addition to the advantages described in the foregoing embodiments, the embodiments of the present application also have the following advantages: on the one hand, the protruding structures 14 and the second insulating layer 16 are both located in the touch-control layer 4, and the protruding structures 14 with a larger refractive index and the second insulating layer 16 with a smaller refractive index constitute a micro-lens pattern, that is, in the present application, the insulating layer in the touch-control layer 4 is also used as a micro-lens pattern, which can effectively improve the light extraction efficiency of the display panel 100' at the front viewing angle without increasing the thickness of the display panel 100'. On the other hand, the through hole 35 penetrating the second insulating sub-layer 22, the first groove 17 correspondingly communicating with the through hole 35, the trench structure 19 penetrating the first insulating sub-layer 20 and the second insulating sub-layer 22, and the second groove 27 correspondingly communicated with the trench structure 19 can be formed by the same process, which can save the process and is beneficial to improve the production efficiency and reduce the cost.

Figure 8:
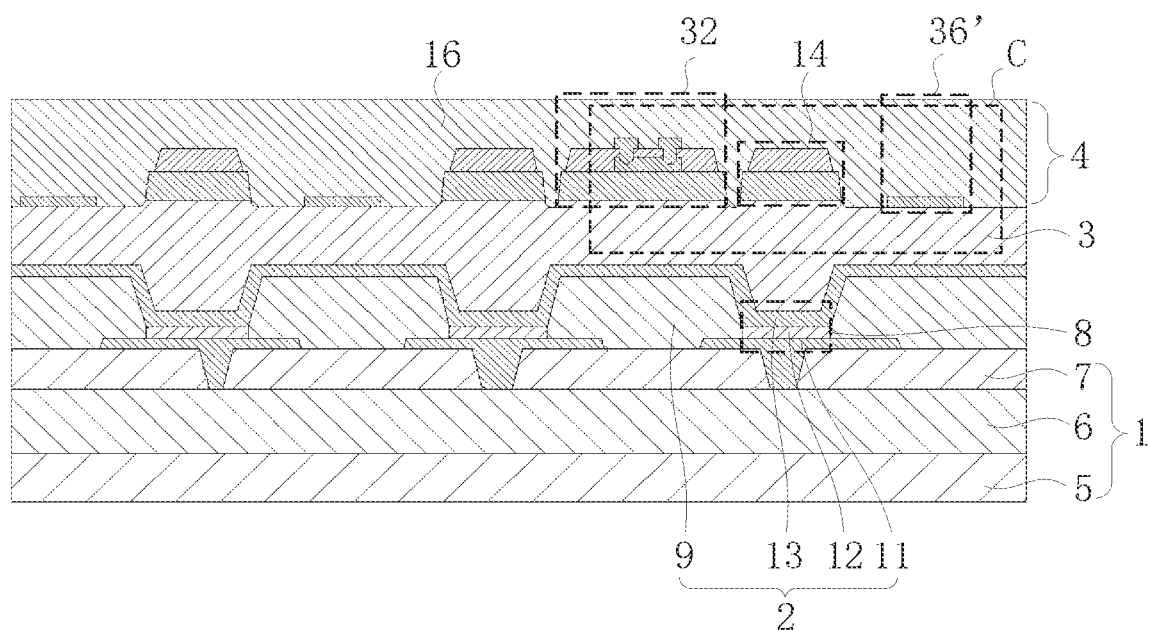
FIG. 8 is a schematic diagram of a partial cross-sectional structure of another display panel according to an embodiment of the present application.
Figure 9:
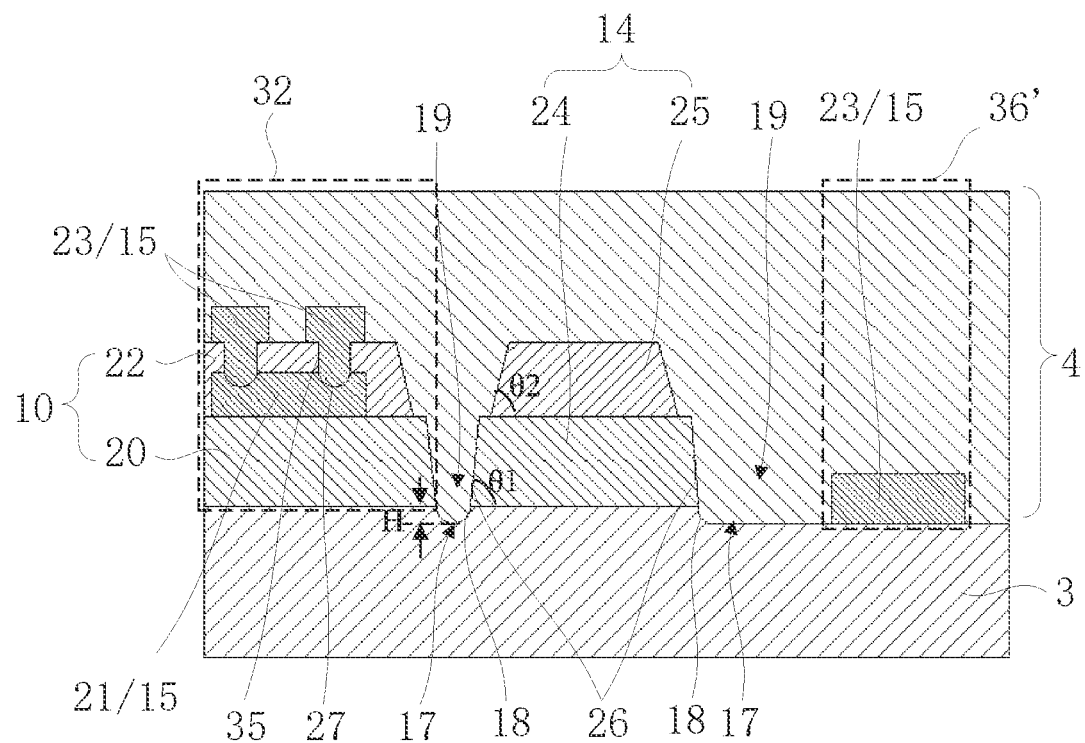
FIG. 9 is a partial enlarged view of the area C in FIG. 8.

As shown in FIG. 8 and FIG. 9, an embodiment of the present application also provides a display panel 100" with a touch function, which is different from the previous embodiment in that the structure of the touch-control layer located in the non-bridge region is different. Specifically, In the embodiment of the present application, the touch-control layer 4 further includes a non-bridge region 36'; the touch-control layer 4 located in the non-bridge region 36' includes a second touch-control metal sub-layer 23 and a second insulating layer 16 which are sequentially stacked on the encapsulation layer 3, wherein the orthographic projection of the first groove 17 on the substrate 5 is also located between the orthographic projections of any two of the protruding structures 14 adjacent to the non-bridge region 36' on the substrate 5.

It is appreciated that the embodiments of the present application are also described by taking the first touch-control metal sub-layer as a bridge metal layer and taking the second touch-control metal sub-layer as a touch-control electrode layer as an example. Certainly, when the first touch-control metal sub-layer is the touch-control electrode layer, the touch-control layer located in the non-bridge region includes the first touch-control metal sub-layer and the second insulating layer which are sequentially superimposed on the encapsulation layer.

Specifically, in the embodiment of the present application, when forming the trench structure 19 described in the foregoing embodiments, the first insulating sub-layer 20 and the second insulating sub-layer 22 in the non-bridge region 36' are hollowed out, so that only the second touch-control metal sub-layer 23 and the second insulating layer 16 are provided in the non-bridge region 36'. It is appreciated that in the embodiment of the present application, the trench structure 19 is also located between any two of the protruding structures 14 disposed adjacent to the non-bridge region 36', and such a design makes the process window for fabricating the trench structure 19 larger, effectively reducing the difficulty of the process.

It is appreciated that since the first groove 17 and the trench structure 19 are formed in the same process, the second touch-control metal sub-layer 23 in the non-bridge region 36' is located in the first groove 17 and is directly connected to the encapsulation layer 3.

In this embodiment of the present application, on the basis of the foregoing embodiments, the first insulating sub-layer 20 and the second insulating sub-layer 22 located in the non-bridge region 36' are hollowed out, so that the second touch-control metal sub-layer 23 in the non-bridge region 36' is directly disposed on the encapsulation layer 3. As such, in addition to the advantages of the foregoing embodiments, the embodiment of the present application can also increase the process window and further reduce the difficulty of the process.

Figure 10:
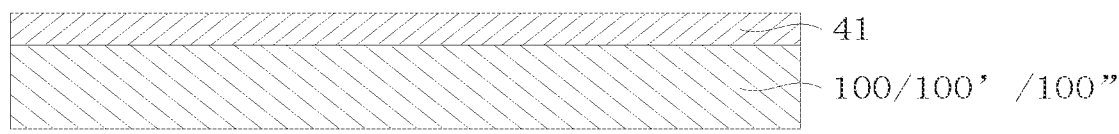
FIG. 10 is a schematic diagram of a partial cross-sectional structure of a display device according to an embodiment of the present application.

As shown in FIG. 10, an embodiment of the present application further provides a display device 40, including the display panel 100 (100', 100") described in any one of the foregoing embodiments.

Specifically, the display device 40 further includes a polarizer 41 located on the display panel 100 (100', 100").

Of course, the display device 40 may also include other structures, such as a protective film and a casing.

In the embodiment of the present application, the display device 40 has the advantages of the display panel 100 (100', 100") described in the above embodiments, so that the light extraction efficiency of the display device 40 is high and the thickness is small.

In the above embodiments, the descriptions of each embodiment have their own emphasis. The parts that are not described in detail in an embodiment can be referred to the detailed descriptions in other embodiments above, which will not be repeated herein for brevity.

The display panel and the display device provided in the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A display panel, comprising:
   a substrate;
   a light-emitting layer disposed on a side of the substrate, wherein the light-emitting layer comprises a plurality of light-emitting units;
   an encapsulation layer disposed on a side of the light-emitting layer away from the substrate;
   a first insulating layer disposed on a side of the encapsulation layer away from the substrate, wherein the first insulating layer comprises a plurality of protruding structures arranged in a one-to-one correspondence with the plurality of light-emitting units; and
   a second insulating layer disposed on a side of the first insulating layer away from the substrate and covering the plurality of protruding structures, wherein a refractive index of the second insulating layer is smaller than a refractive index of the first insulating layer,
   wherein a surface of a side of the encapsulation layer close to the first insulating layer is provided with a first groove, the first groove is defined close to an edge of the plurality of protruding structures, the second insulating layer is filled in the first groove, and a refractive index of the encapsulation layer is greater than the refractive of the second insulating layer.

2. The display panel according to claim 1, wherein an included angle between a sidewall and a bottom surface of each of the protruding structures is greater than 0 and less than 90°.

3. The display panel according to claim 1, wherein the first groove comprises a first sidewall adjacent to an adjacent one of the protruding structures, and the adjacent one of the protruding structures comprises a second sidewall adjacent to the first groove; and
   wherein the first sidewall and the second sidewall are connected to each other and located on a same continuous surface.

4. The display panel according to claim 3, wherein a side of the first groove close to a corresponding one of the light-emitting units is arc-shaped, and a depth of the first groove is greater than 0 and less than or equal to 1000 nanometers.

5. The display panel according to claim 3, wherein the encapsulation layer comprises a first inorganic encapsulation sub-layer, an organic encapsulation sub-layer, and a second inorganic encapsulation sub-layer sequentially stacked on the light-emitting layer; and
   wherein the first groove is arranged on a surface of the second inorganic encapsulation sub-layer close to the first insulating layer, and a refractive index of the second inorganic encapsulation sub-layer is greater than the refractive index of the second insulating layer.

6. The display panel according to claim 1, wherein the first groove is disposed around the protruding structures.

7. The display panel according to claim 1, wherein each of the protruding structures comprises a first sub-protruding structure and a second sub-protruding structure stacked on the encapsulation layer in sequence, a first included angle is formed between a sidewall of the first sub-protruding structure and a bottom surface of the first sub-protruding structure, and a second included angle is formed between a sidewall of the second sub-protruding structure and a bottom surface of the second sub-protruding structure; and
   wherein the first included angle is greater than the second included angle, and each of the first included angle and the second included angle is greater than 0° and less than 90°.

8. The display panel according to claim 1, wherein a material of the first insulating layer comprises an inorganic insulating material, and a material of the second insulating layer comprises an organic insulating material.

9. The display panel according to claim 1, wherein the display panel further comprises a touch-control layer disposed on the side of the encapsulation layer away from the substrate, and the touch-control layer comprises the first insulating layer, a touch-control metal layer, and the second insulating layer; and
   wherein the touch-control metal layer is disposed between the plurality of protruding structures.

10. The display panel according to claim 9, wherein the first insulating layer comprises a first insulating sub-layer and a second insulating sub-layer sequentially stacked on the encapsulation layer, a refractive index of each of the insulating layer and the second insulating sub-layer is greater than the refractive index of the second insulating layer; and
    wherein a material of the protruding structures is same as a material of at least one of the first insulating sub-layer or the second insulating sub-layer.

11. The display panel according to claim 10, wherein each of the protruding structures comprises a first sub-protruding structure and a second sub-protruding structure stacked on the encapsulation layer in sequence, a first included angle is formed between a sidewall of the first sub-protruding structure and a bottom surface of the first sub-protruding structure, a second included angle is formed between a sidewall of the second sub-protruding structure and a bottom surface of the second sub-protruding structure, the first included angle is greater than the second included angle, and each of the first included angle and the second included angle is greater than 0° and less than 90°; and
    wherein the first sub-protruding structure is located in the first insulating sub-layer, and the second sub-protruding structure is located in the second insulating sub-layer.

12. The display panel according to claim 11, wherein a height of the first sub-protruding structure in a direction perpendicular to the substrate is greater than or equal to a height of the second sub-protruding structure in the direction perpendicular to the substrate.

13. The display panel according to claim 10, wherein the materials of the first insulating sub-layer and the second insulating sub-layer are same.

14. The display panel according to claim 9, wherein the touch-control layer comprises at least a bridge region, the touch-control metal layer comprises a first touch-control metal sub-layer and a second touch-control metal sub-layer, the touch-control layer in the bridge region comprises the first insulating sub-layer, the first touch-control metal sub-layer, the second insulating sub-layer, the second touch-control metal sub-layers, and the second insulating layer stacked on the encapsulation layer in sequence; and the second touch-control metal sub-layer is electrically connected to the first touch-control metal sub-layer through a through hole penetrating the second insulating sub-layer; and wherein an orthographic projection of the first groove on the substrate is at least between an orthographic projection of the bridge region on the substrate and an orthographic projection of the protruding structures on the substrate, a surface of a side of the first touch-control metal sub-layer away from the substrate is provided with a second groove correspondingly communicated with the through hole, and the second touch-control metal sub-layer is further disposed in the second groove.

15. The display panel according to claim 14, wherein the touch-control layer further comprises a non-bridge region, and the touch-control layer in the non-bridge region comprises the first insulating sub-layer, the second insulating sub-layer, the second touch-control metal sub-layer, and the second insulating layer stacked on the encapsulation layer in sequence; or wherein the touch-control layer in the non-bridge region comprises the first insulating sub-layer, the first touch-control metal sub-layer, the second insulating sub-layer, and the second insulating layer stacked on the encapsulation layer in sequence; and wherein, the orthographic projection of the first groove on the substrate is further located between an orthographic projection of the non-bridge region on the substrate and the orthographic projection of the protruding structures on the substrate.

16. The display panel according to claim 14, wherein the touch-control layer further comprises a non-bridge region; the touch-control layer in the non-bridge region comprises the first touch-control metal sub-layer and the second insulating layer stacked on the encapsulation layer in sequence, or the touch-control layer in the non-bridge region comprises the second touch-control metal sub-layer and the second insulating layer stacked on the encapsulation layer in sequence; and wherein the orthographic projection of the first groove on the substrate is further located between orthographic projections of any two of the protruding structures adjacent to the non-bridge region on the substrate.

17. A display device, comprising the display panel according to claim 1.

* * * * *